United States Patent [19]

Miyajiri et al.

[11] Patent Number: 4,545,801
[45] Date of Patent: Oct. 8, 1985

[54] RAW MATERIAL SUPPLY DEVICE

[75] Inventors: Tetsuo Miyajiri; Toshimi Habasaki; Hiroshi Yokota; Tamio Tsurita, all of Osaka; Motohiro Nakahara, Ibaraki, all of Japan

[73] Assignees: Sumitomo Electric Industries, Ltd.; Nippon Telegraph & Telephone Public Corporation, both of Japan

[21] Appl. No.: 577,419

[22] Filed: Feb. 6, 1984

[51] Int. Cl.[4] ............................................. C03P 37/00
[52] U.S. Cl. ...................................... 65/157; 118/693; 118/715; 118/726; 137/209; 137/211
[58] Field of Search ............... 65/1, 3.12, 157, 161, 65/163; 118/726, 715, 693, 694; 427/255.1, 248.1; 137/392, 211, 206, 209

[56] References Cited

U.S. PATENT DOCUMENTS

| | | | |
|---|---|---|---|
| 2,376,694 | 5/1945 | Hewlett | 137/392 X |
| 3,084,708 | 4/1963 | Herrero | 137/392 |
| 3,195,464 | 7/1965 | Shetler | 137/211 |
| 3,473,959 | 10/1969 | Ehinger | 118/715 X |
| 3,901,182 | 8/1975 | Chiang | 118/715 |
| 4,295,913 | 10/1981 | Purr | 118/694 X |
| 4,314,837 | 2/1982 | Blankenship | 65/3.12 |

Primary Examiner—Kenneth M. Schor
Attorney, Agent, or Firm—Sughrue, Mion, Zinn, Macpeak, and Seas

[57] ABSTRACT

A device is disclosed for supplying a glass raw material gas in the form of the mixed gas consisting of the glass raw material gas and the carrier gas to a vapor deposition device for producing a preform of an optical fiber, the supply device including a secondary raw material container having a pressurizable interior and provided adjacent to a main raw material container. The bottoms, or areas near the bottoms, of the two containers are interconnected via a pipe including at a mid portion thereof a switching valve and a device for adjusting the flow rate of the raw material liquid between the two containers. Liquid level detectors are provided in one or both containers to maintain the constant volume of the liquid raw material so as to provide a constant state inside the main raw material container. The operation of this device can easily be entirely automated.

7 Claims, 8 Drawing Figures

RAW MATERIAL SUPPLY DEVICE

BACKGROUND OF THE INVENTION

The present invention relates to a raw material supply device for supplying a gaseous glass raw material (frit) to a reaction device of producing a preform (mother material) used in the production of an optical fiber.

For producing a preform for optical fiber of a type used for communication, a MCVD method, a VAD method and like methods have been employed. Such methods are described in "Techniques of Optical Fiber for Communication on Survey of The Patent Journal" (compiled by the Japanese Patent Office, published by The Invention Association of Japan) Apr. 20, 1982, pp. 89–122. According to any one of these methods, in order to obtain glass of high transparency and high purity, a supply of liquid glass raw material (frit) of which silicon tetracloride serves as the main raw material and including germanium tetracloride or the like as a dopant, is put into a raw material container. Into this container, a carrier gas is introduced which evaporates the raw material. The carrier gas including the gaseous raw material in the saturated or nearly saturated state is applied to a reaction device for production of the preform. Within the reaction device, the gas is oxidized, resulting in an accumulation of a grained oxide production, namely, the preform.

A conventional raw material supply device for implementing the above process was constructed as shown in FIG. 1. In this device, a liquid glass raw material 2 is charged in a raw material container 1 and this container, in turn, is received in a temperature-controlled bath 3 employed to maintain the temperature of the material container and its contents uniform. The raw material container 1 is secured to the bottom of the temperature-controlled bath 3 directly or indirectly via supporting stands 4. A carrier gas 5' is introduced into the raw material container 1 through a pipe 5 and a flow control device 6 (such as a mass flowmeter). The carrier gas 5', which is supplied in a bubbling state, absorbs the raw material gas, becoming saturated or nearly saturated therewith. The gas, which is now a reacting gas 7', is passed from the raw material container 1 through a pipe 7 to a reaction device (not shown). In the above-described process, the carrier gas need not necessarily be supplied in the bubbling state. It is possible merely to introduce the gas into a space above the liquid level and cause the same to be mixed with the raw material gas evaporated from the liquid surface.

When the liquid raw material decreases in volume as a result of consumption, a shut-off valve 8 provided on a supplement pipe 9 coupled to the raw material container 1 is opened so that a supply of liquid raw material 9' is passed under pressure to the raw material container 1 from a service tank (not shown), thereby to recharge the liquid raw material. In the foregoing system, however, the pressure and temperature inside the raw material container can vary greatly at the time of liquid supplement, resulting in a difficulty that the desired reaction will not proceed as required, making it necessary to halt the operation of the reaction device until the raw material supply device recovers its normal state. As the operating time of the reaction device becomes longer, as has been the tendency in recent systems, and as the velocity of reaction, that is, the rate of consumption of the raw material, increases, the operating rate of the reaction device is actually lowered due to the necessity of liquid supplement. It is not possible to alleviate this problem significantly by an enlargement in the volume of the raw material container. Moreover, other difficulties such as leakage of liquid caused by the increase in the frequency of the liquid supplement occur.

SUMMARY OF THE INVENTION

A primary object of the invention is thus to overcome the foregoing problems. According to the invention, a conventional raw material container is utilized as the main raw material container. In addition, a secondary raw material container is provided. The two containers are connected via a pipe including therein a flow control device. One or more liquid level detectors are provided in the main raw material container or in both containers to maintain the volume of the liquid raw material within a certain range so as to not disturb the state inside the main raw material container. The supplementing of the liquid raw material is completely automated. Accordingly, long-time continuous running of the reaction device is realized, thereby allowing production of preforms of large size.

DESCRIPTION OF THE PREFERRED EMBODIMENTS

The invention will now be described with reference to the drawings.

Figure 2:
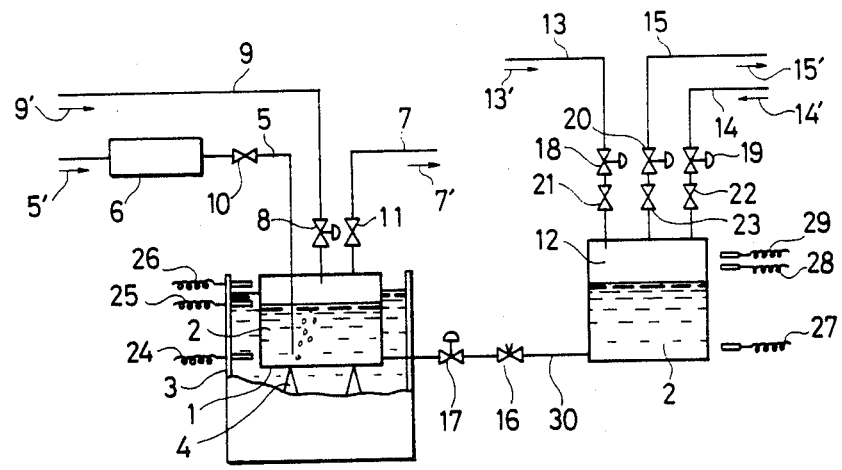
FIG. 2 is a frontal view showing an embodiment of a raw material supply device constructed according to the invention.

As shown in FIG. 2, the main raw material container 1 is secured to the bottom of the temperature-controlled bath 3 by means of supporting stands 4. Carrier gas 5' is introduced into the main raw material container, through pipe 5 and a flow control device 6, in the bubbling state. The gas 7' including the raw material gas in the saturated or nearly saturated state is passed to the reaction device through the pipe 7. A pipe 9 is coupled to the main raw material container for introducing initially and manually liquid raw material from a service tank. There is no need, however, to use this pipe in the normal and continuous running of the reaction device.

Three liquid level detectors 24, 25 and 26 are provided in the main raw material container to detect a respective normal lowest liquid level, normal highest liquid level and abnormal uppermost liquid level (an emergency overflow level) of the liquid raw material.

A secondary raw material container 12 is provided adjacent to the main raw material container. Both containers are connected at their bottoms or portions adjacent their bottoms by a pipe 30 which includes a manually or automatically operated switching valve 17 and a flow regulating valve (a needle valve) 16. To the secondary raw material container 12 there are coupled a pipe 13 for introducing liquid raw material 13', a pipe 14 for introducing a pressurizing gas 14' to pressurize the secondary raw material container to force the liquid raw material out under pressure, and a pipe 15 for gas venting (purging). These pipes are provided with respective manually operated switching valves 18, 19 and 20 and automatic switching valves 21, 22 and 23. Similar to the main raw material container, liquid level detectors 27, 28 and 29 are provided.

FIGS. 3A to 3F indicate the operation of the foregoing raw material supply device. To actuate the raw material supply device, at first the shut-off valve 8 and the switching valve 18 are opened to charge the liquid raw material in the main raw material container and the secondary raw material container from the service tank. Then, the switching valve 19 is opened to introduce pressurizing gas into the upper space of the secondary raw material container 12 so as to pressurize the latter. Then, the switching valve 17 connecting the main raw material container and the secondary raw material container is opened. When the temperature of the main raw material container has become constant due to the operation of the temperature-controlled bath, the carrier gas is introduced through the pipe 5 and supplying of the raw material gas is commenced through the pipe 7 to the reaction device.

Figure 3A:
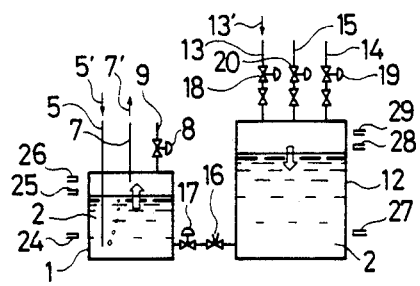
FIGS. 3A–3F are frontal views showing several operational situations of the device shown in FIG. 2.
Figure 3B:
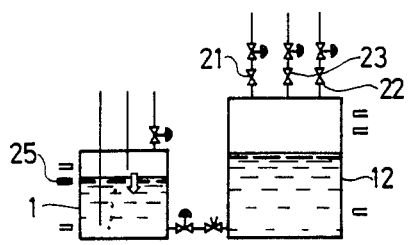

The flow rate of the liquid raw material flowing from the secondary raw material container into the main raw material container is controlled by the needle valve 16 relative to the flow rate of the raw material from the main raw material container to the reaction device, that is, the rate of consumption of the raw material. So controlled, the liquid level in the main raw material container rises gradually and the liquid level in the secondary raw material container lowers as shown in FIG. 3A. Because the rate of consumption of the raw material is generally small, the temperature, pressure and the like inside the main raw material container are maintained substantially constant even through liquid raw material is supplemented from the secondary raw material container at a rate slightly larger than the consumption rate.

Specific examples of applications of the invention will now be described:

Using SiCl$_4$ as an example and assuming that the rate of consumption in the main raw material containers is 2 g/min, the supplementing rate from the secondary raw material container is 3 g/min and its temperature is 25° C., and the volume of the liquid in the main raw material container is 2 liters and its temperature is 50° C., because the specific gravity of SiCl$_4$ is 4.48, the temperature drop of the liquid in the main raw material container under the condition that the temperature control function is completely ineffective for one minute is:

$$50° C. - \frac{2 \text{ liters} \times 1.45 \text{ kg/l} \times 50° C. + 0.003 \text{ kg} \times 25° C.}{2 \text{ liters} \times 1.48 \text{ kg/l} + 0.003 \text{ kg}} =$$

$$0.03° C.$$

That is, the foregoing example results in a temperature drop of merely 0.03 degrees.

Figure 3C:
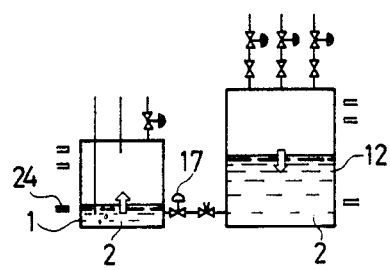

As the liquid level in the main raw material container 1 reaches the highest limit as shown in FIG. 3A, the liquid level detector 25 operates to close the switching valve 17 and, in turn, to halt the supply from the secondary raw material container. Then, as the liquid level in the main raw material container lowers and reaches the lowest limit as shown in FIG. 3C, the liquid level detector 24 operates to open the switching valve 17 and, in turn, to commence again the supply of the liquid raw material to the secondary raw material container.

Figure 3D:
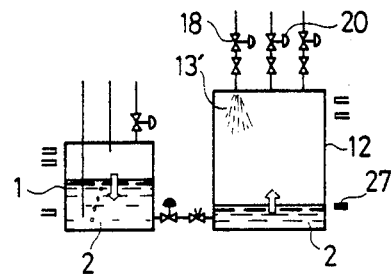
Figure 3E:
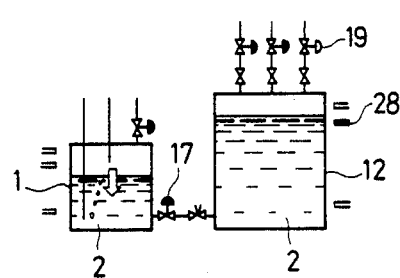
Figure 3F:
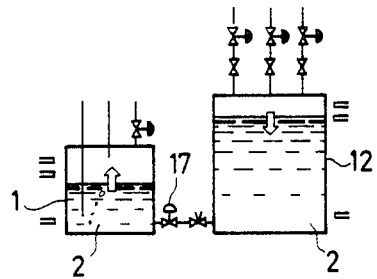

Under normal operating conditions, the foregoing operations are repeated. However, if the liquid raw material in the secondary raw material container decreases, and as the liquid level in the secondary raw material container reaches the lowest limit as shown in FIG. 3D, the liquid level detector 27 operates to close the shut-off valve 17 and then to open the shut-off valve 20 so that the pressurizing gas is purged through the gas-venting pipe 15 of the secondary raw material container, and further to open the shut-off valve 18 so that liquid raw material 13' is supplemented from the service tank into the secondary raw material container 12. When the liquid level in the secondary raw material container 12 reaches the highest limit as shown in FIG. 3E, the liquid level detector 28 operates to close the shut-off valves 18 and 20 and open the shut-off valve 19 so that the pressurizing gas pressurizes the secondary raw material container. Upon termination of the introduction of the pressurizing gas, the shut-off valve 19 closes and the shut-off valve 17 opens, whereupon the system assumes the state shown in FIG. 3F and then returns to the state shown in FIG. 3A. In the foregoing operation, it is also possible to open the shut-off valve 17 when the liquid level in the main raw material container reaches the lowest limit after the supplementation of the liquid raw material to the secondary raw material container has terminated. Although the pressurizing gas is introduced when the liquid level in the secondary raw material container reaches the highest limit, the pressure in the secondary raw material container should be maintained at a level sufficient for the liquid raw material to be forced under pressure to the main raw material container even when the liquid level in the secondary raw material container reaches the lowest limit.

Although the foregoing description relates to the case where the switching valves are operated manually. By changing the switching valve 17 to an automatic one and employing automatic switching valves 18, 19 and 20 in the pipes coupled to the secondary raw material container, it is possible to remotely control the system by the use of the signals from liquid level detectors 24, 25, 27 and 28, or to automate all operations relating to liquid supplementation to realize a fully automated system.

The conditions of the liquid raw material in the main raw material container can be maintained more uniform if the secondary raw material container of the system is situated in a temperature-controlled bath so as to maintain the liquid temperature therein equal to or nearly equal to the temperature of the liquid raw material in the main raw material container and to open the shut-off valve 17 after having awaited stabilization of the temperature of the liquid raw material following liquid supplementation to the secondary raw material container. Also, a heater can be provided midway of the pipe to thereby control the temperature of the liquid raw material flowing into the main raw material container so as to be equal to the temperature of the liquid raw material in the main raw material container.

Figure 1:
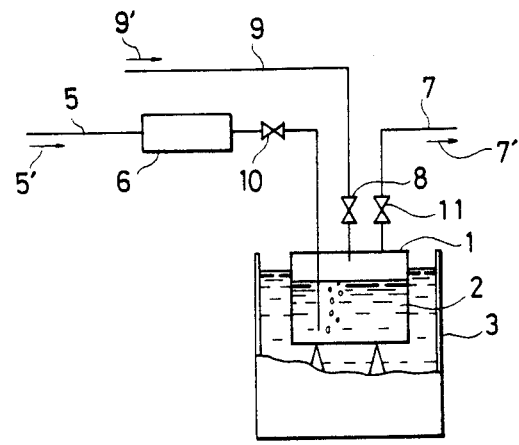
FIG. 1 is a frontal view of a conventional raw material supply device.

The reasons why the mutual connection of the liquid phase portions is important to the invention will be described with reference to FIG. 1.

Denoting the flow rate of the carrier gas 5 as determined by the flow control device 6 and supplied to main raw material contained 1 by $V_c$, the flow rate of the raw material gas 7 which is evaporated in the main raw material container and supplied to the reaction device by $V_s$, the temperature of the liquid raw material 2 at the liquid surface of the raw material in the main raw material container by $T_s$, the partial pressure of the carrier gas in the gaseous phase above the liquid surface in the main raw material container by $P_c$, the partial pressure of the gaseous raw material by $P_s$, the molar number of the carrier gas by $N_c$, and the molar number of the raw material gas by $N_s$, in accordance with the law of partial pressure:

$$\frac{N_s}{N_c} = \frac{P_s}{P_c}, \text{ and} \qquad (1)$$

$$\frac{N_s}{N_c} = \frac{V_s}{V_c}. \qquad (2)$$

Therefore, $$V_s = V_c \frac{P_s}{P_c}. \qquad (3)$$

Further, $$V_c = \text{constant}. \qquad (4)$$

In addition, assuming that $P_s$, the saturated vapor pressure, is a function only of $T_s$ and by strictly temperature controlling $T_s$, the following is assumed:

$$P_s = \text{constant}. \qquad (5)$$

Then, if it is possible to assume that the pressure inside the reaction container is constant (such as being opened substantially to the atmosphere):

$$P_c + P_s = \text{constant}. \qquad (6)$$

From equations (5) and (6):

$$P_c = \text{constant}. \qquad (7)$$

As a result, $V_s$ represented by equation (3) is understood to be controlled and maintained constant, as is apparent from equations (4), (5) and (7).

The liquid raw material supplied from the secondary raw material container 12 to the gaseous phase portion is indicated by the arrow " " in the drawing. If the liquid raw material were introduced intermittently or dripped into the main raw material container, and assuming each droplet evaporates before reaching the liquid surface, a partial pressure $P_s'$ ($\neq P_s$) results which is determined solely by the latent heat of evaporation, and thus the ratio of partial pressures $P_s/P_c$ of the gaseous portion in the container would be caused to vary. On the other hand, if the liquid droplet reaches the liquid surface, there would result disturbances on the liquid surface and variations in temperature, which are unfavorable. Further, if the raw material were introduced in the evaporated state into the main raw material container 1 with the connecting pipe 30 heated, maintaining the temperature of the heated vapor equal to that of the vapor in the main raw material container 2 would be remarkably difficult.

As described hereinabove, the device of the invention does not change the state inside the main raw material container during supplementation of the liquid raw material, and thus the invention allows for continuous long-time operation of the reaction device. Moreover, the operating rate of the reaction device is increased, and the manufacture of preforms of large size is made possible. Further, by providing the liquid level detectors, liquid supplementation can be automated fully.

We claim:

1. A raw material supply device for supplying a glass-forming raw material gas in the form of a mixed gas consisting of said glass-forming raw material gas and a carrier gas to a vapor deposition device for producing a preform of an optical fiber, the supply device comprising: a pressurized main raw material container having means for supplying said glass-forming gas as said mixed gas from said main raw material container to said vapor deposition device for producing a preform, a secondary raw material container having a pressurizable interior and means to pressurize said interior, said secondary container being provided adjacent to said pressurized main raw material container, means for providing liquid glass-forming raw material to said secondary raw material container, pipe means for conveying raw material liquid phase portions from said secondary container to said main container, said pipe means connected to both of said containers at their respective bottoms or substantially at said bottoms, said pipe means comprising a first pipe including a switching valve at a mid portion of said pipe, means for opening and closing said switching valve in response to fluid level in said main container, and means for adjusting the flow rate of the raw material liquid into said main container, such that the flow into the main container is controlled relative to the flow of raw material out of the main container.

2. The raw material supply device as claimed in claim 1, wherein said flow rate adjusting means comprises a needle valve.

3. The raw material supply device as claimed in claim 1, with said means to pressurize further comprising a second pipe for passing a pressurizing gas from a pressurizing gas supply source to pressurize said secondary raw material container, and a switching valve coupled to said second pipe.

4. The raw material supply device as claimed in claim 1, further comprising, for each of said main raw material container and said secondary raw material container, a third pipe for conveying liquid raw material from a service tank, and a switching valve coupled to said third pipe.

5. The raw material supply device as claimed in claim 1, further comprising means for maintaining the temperature of the liquid raw material flowing into said main raw material container near the temperature of the raw material in said main raw material container, said temperature maintaining means being provided in one of said secondary raw material container and said first pipe connecting said main raw material container and said secondary raw material container.

6. The raw material supply device as claimed in claim 1, further comprising liquid level detecting means for detecting electrically at least one of a liquid level highest limit and lowest limit of the liquid raw material in each of said main and secondary raw material containers.

7. The raw material supply device as claimed in claim 1, further comprising a switching valve provided in a raw material supply pipe to said secondary raw material container, first and second switching valves provided in purging pipes for the pressurizing gas, a switching valve provided in said first pipe connecting said main raw material container and said secondary raw material container, and means for automatically controlling said valves in accordance with signals from said liquid level detecting means.

* * * * *